(12) United States Patent
Bae

(10) Patent No.: US 12,193,234 B2
(45) Date of Patent: Jan. 7, 2025

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventor: Byung Wook Bae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 514 days.

(21) Appl. No.: 17/513,494

(22) Filed: Oct. 28, 2021

(65) Prior Publication Data

US 2022/0359560 A1 Nov. 10, 2022

(30) Foreign Application Priority Data

May 6, 2021 (KR) .................. 10-2021-0058760

(51) Int. Cl.
*H10B 43/27* (2023.01)
*H01L 23/00* (2006.01)
(Continued)

(52) U.S. Cl.
CPC ............. *H10B 43/27* (2023.02); *H01L 24/08* (2013.01); *H01L 24/80* (2013.01);
(Continued)

(58) Field of Classification Search
CPC ..... H01L 25/0657; H01L 24/08; H01L 24/80; H01L 25/18; H01L 25/50; H01L 23/5223; H01L 27/0733; H01L 27/0629; H01L 23/5226; H01L 28/90; H01L 21/67063; H01L 29/0653; H01L 2924/14511; H01L 2224/05556; H01L 2224/80895; H01L 2224/08058; H01L 2924/1431; H01L 2224/80896; H01L 2224/08145; H01L 2221/1063; H10B 43/40; H10B 41/27; H10B 43/35; H10B 43/27; H10B 43/50; (Continued)

(56) References Cited

U.S. PATENT DOCUMENTS 10,665,581 B1 * 5/2020 Zhou ................... H01L 27/0688
11,758,730 B2 * 9/2023 Toyama ............. H01L 25/0657
257/213
(Continued)

FOREIGN PATENT DOCUMENTS

KR 1020160080365 A 7/2016

*Primary Examiner* — Mouloucoulaye Inoussa
(74) *Attorney, Agent, or Firm* — WILLIAM PARK & ASSOCIATES LTD.

(57) ABSTRACT

A semiconductor memory device includes a bit line, a common source pattern above the bit line, a channel layer in contact with the common source pattern, the channel layer extending toward the bit line, and a filling insulating layer disposed between the bit line and the common source pattern, the filling insulating layer surrounding a first part of the channel layer. The semiconductor memory device also includes a gate stack structure disposed between the bit line and the filling insulating layer, the gate stack structure surrounding a second part of the channel layer. The semiconductor memory device further includes a first etch stop pattern on a sidewall of the filling insulating layer, a second etch stop pattern between the first etch stop pattern and the filling insulating layer, and a memory pattern between the gate stack structure and the channel layer.

15 Claims, 16 Drawing Sheets

(51) Int. Cl.
*H01L 25/00* (2006.01)
*H01L 25/065* (2023.01)
*H01L 25/18* (2023.01)
*H10B 41/27* (2023.01)

(52) U.S. Cl.
CPC .......... *H01L 25/0657* (2013.01); *H01L 25/18* (2013.01); *H01L 25/50* (2013.01); *H10B 41/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ........ H10B 41/20; H10B 41/30; H10B 41/46; H10B 41/35; H10B 41/40; H10B 41/50; H10B 41/41; G11C 8/14; G11C 16/24; G11C 16/0483; G11C 16/06
See application file for complete search history.

(56) References Cited

U.S. PATENT DOCUMENTS

| | | | |
|---|---|---|---|
| 2017/0373087 A1* | 12/2017 | Ito | H10B 43/50 |
| 2019/0312012 A1 | 10/2019 | Tagami et al. | |
| 2021/0005593 A1* | 1/2021 | Lee | H10B 43/27 |
| 2021/0036001 A1* | 2/2021 | Kim | H01L 23/5223 |
| 2021/0043647 A1* | 2/2021 | Kim | H10B 43/10 |
| 2021/0065801 A1* | 3/2021 | Kwon | G11C 16/26 |
| 2021/0066281 A1* | 3/2021 | Kwon | H01L 25/0657 |
| 2021/0175241 A1* | 6/2021 | Ryu | H10B 63/34 |
| 2021/0183683 A1* | 6/2021 | Sherbin | H01L 21/67132 |
| 2021/0217769 A1* | 7/2021 | Lee | H10B 43/35 |
| 2021/0257386 A1* | 8/2021 | Wang | H10B 41/10 |
| 2021/0320119 A1* | 10/2021 | Zhang | H10B 43/27 |
| 2021/0320121 A1* | 10/2021 | Wu | H10B 43/27 |
| 2021/0375828 A1* | 12/2021 | Zhang | H01L 24/80 |
| 2021/0375900 A1* | 12/2021 | Zhang | H10B 43/27 |
| 2021/0375912 A1* | 12/2021 | Zhang | H10B 41/46 |
| 2021/0375915 A1* | 12/2021 | Zhang | H10B 43/40 |
| 2021/0375916 A1* | 12/2021 | Zhang | H10B 43/27 |
| 2022/0077182 A1* | 3/2022 | Lee | H10B 41/27 |

* cited by examiner

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2021-0058760, filed on May 6, 2021, in the Korean Intellectual Property Office, the entire disclosure of which is incorporated herein by reference.

BACKGROUND

Technical Field

The present disclosure generally relates to a semiconductor memory device and a manufacturing method of a semiconductor memory device, and more particularly, to a three-dimensional semiconductor memory device and a manufacturing method of a three-dimensional semiconductor memory device.

Related Art

A semiconductor memory device includes a plurality of memory cells capable of storing data. A three-dimensional semiconductor memory device may include a plurality of three-dimensionally arranged memory cells. As a plurality of memory cells are three-dimensionally arranged, the area of a substrate occupied by the plurality of memory cells may be decreased, and thus the degree of integration of a semiconductor memory device may be improved.

The operational reliability of a three-dimensional semiconductor memory device may deteriorate due to various causes occurring in a process of manufacturing the three-dimensional semiconductor memory device.

SUMMARY

In accordance with an embodiment of the present disclosure, a semiconductor memory device includes: a bit line; a common source pattern above the bit line; a channel layer in contact with the common source pattern, the channel layer extending toward the bit line; a filling insulating layer disposed between the bit line and the common source pattern, the filling insulating layer surrounding a first part of the channel layer; a gate stack structure disposed between the bit line and the filling insulating layer, the gate stack structure surrounding a second part of the channel layer; a first etch stop pattern on a sidewall of the filling insulating layer; a second etch stop pattern between the first etch stop pattern and the filling insulating layer; and a memory pattern between the gate stack structure and the channel layer.

In accordance with an embodiment of the present disclosure, a method of manufacturing a semiconductor memory device includes: forming a groove in a substrate; sequentially stacking a first etch stop layer and a second etch stop layer along a surface of the groove; forming a filling insulating layer on the second etch stop layer such that a central region of the groove is filled with the filling insulating layer; forming a preliminary memory cell array including a gate stack structure on the filling insulating layer, a hole penetrating the gate stack structure and the filling insulating layer, a memory layer extending along a surface of the hole, and a channel layer on the memory layer; exposing the first etch stop layer by removing a portion of the substrate from a back surface of the substrate, which faces a direction opposite to a surface of the substrate facing the gate stack structure; selectively removing a portion of the first etch stop layer such that the second etch stop layer is o exposed; selectively removing a portion of the second etch stop layer such that the memory layer is exposed; and selectively removing a portion of the memory layer such that the channel layer is exposed.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or additional intervening elements may also be present. Like reference numerals refer to like elements throughout the drawings.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

Hereinafter, the terms 'first' and 'second' are used to distinguish one component from another component and are not meant to imply a specific number or order of components. The terms may be used to describe various components, but the components are not limited by the terms.

Some embodiments are directed to a semiconductor memory device having improved operational reliability and a manufacturing method of the semiconductor memory device.

Figure 1:
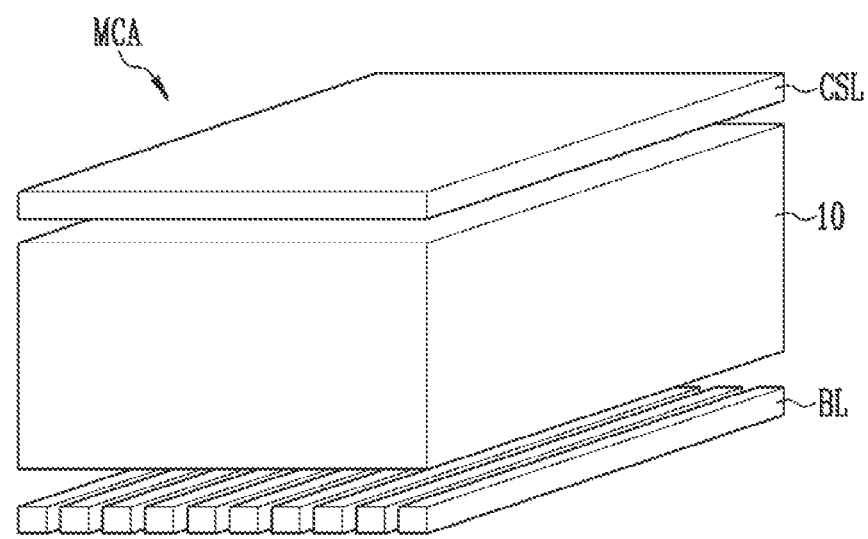
FIG. 1 is a view schematically illustrating a memory cell array of a semiconductor memory device in accordance with an embodiment of the present disclosure.

FIG. 1 is a view schematically illustrating a memory cell array of a semiconductor memory device in accordance with an embodiment of the present disclosure.

Referring to FIG. 1, a memory cell array MCA may include a plurality of bit lines BL, a common source pattern CSL, and a memory block 10.

The plurality of bit lines BL may be spaced apart from each other, and extend in parallel to each other. In an embodiment, the plurality of bit lines BL may be spaced apart from each other in an X-axis direction, and extend in a Y-axis direction. However, the present disclosure is not limited thereto.

The common source pattern CSL may overlap with the plurality of bit lines BL with the memory block 10 interposed therebetween. The common source pattern CSL may extend on an XY plane.

The memory block 10 may be disposed between the plurality of bit lines BL and the common source pattern CSL. The memory block 10 may include a plurality of memory cell strings. Each memory cell string may be connected to not only a corresponding bit line BL but also the common source pattern CSL through a channel layer of a cell plug.

Figure 2:
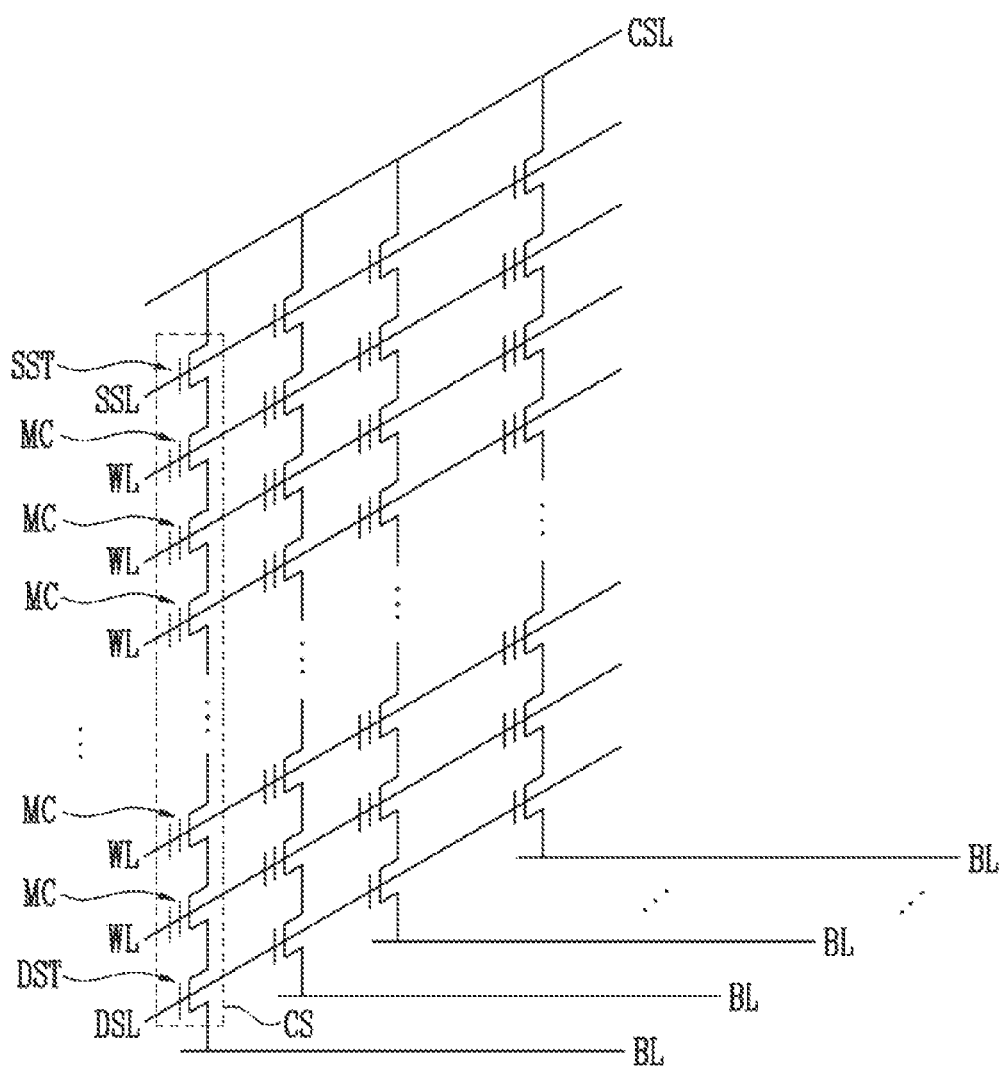
FIG. 2 is a circuit diagram illustrating the memory cell array shown in FIG. 1.

FIG. 2 is a circuit diagram illustrating the memory cell array MCA shown in FIG. 1.

Referring to FIG. 2, the memory cell array MCA may include a plurality of memory cell strings CS respectively connected to the plurality of bit lines H. The plurality of memory cell strings CS may be connected in parallel to the common source pattern CSL.

Each memory cell string CS may include at least one drain select transistor DST, a plurality of memory cells MC, and at least one source select transistor SST.

The plurality of memory cells MC may be connected in series between the drain select transistor DST and the source select transistor SST. The plurality of memory cells MC may be connected to the common source pattern CSL via the source select transistor SST. The plurality of memory cells MC may be connected corresponding to a bit line via the drain select transistor DST.

The plurality of memory cells MC may be respectively connected to a plurality of word lines WL. Operation of the plurality of memory cells MC may be controlled by gate signals applied to the plurality of word lines WL. The drain select transistor DST may be connected to a drain select line DSL. Operation of the drain select transistor DST may be controlled by a gate signal applied to the drain select line DSL. The source select transistor SST may be connected to a source select line SSL. Operation of the source select transistor SST may be controlled by a gate signal applied to the source select line SSL. The source select line SSL, the plurality of word lines WL, and the drain select line DSL may be implemented by conductive patterns stacked to be spaced apart from each other.

Figure 3A:
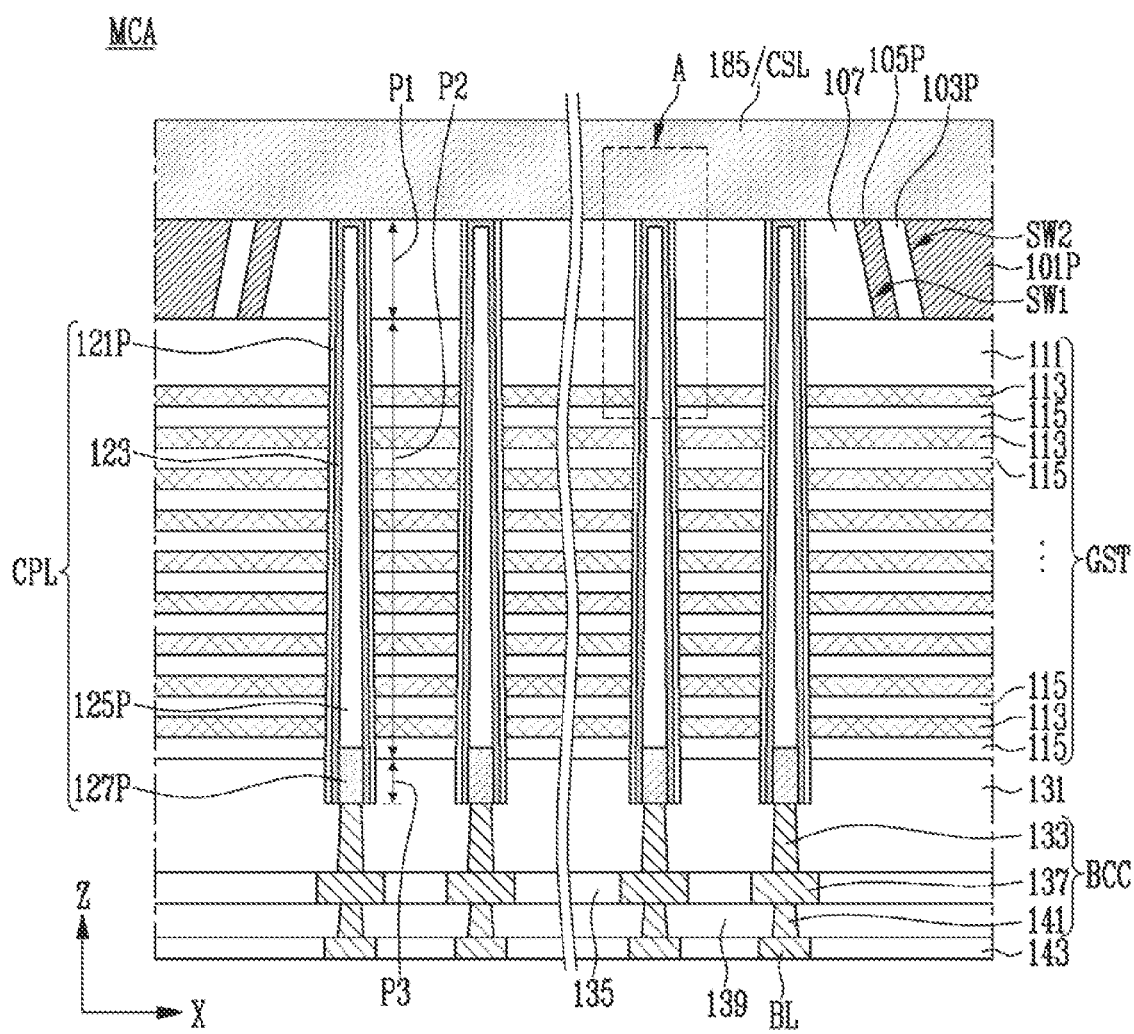
FIGS. 3A and 3B are sectional views illustrating an embodiment of the memory cell array shown in FIG. 1.
Figure 3B:
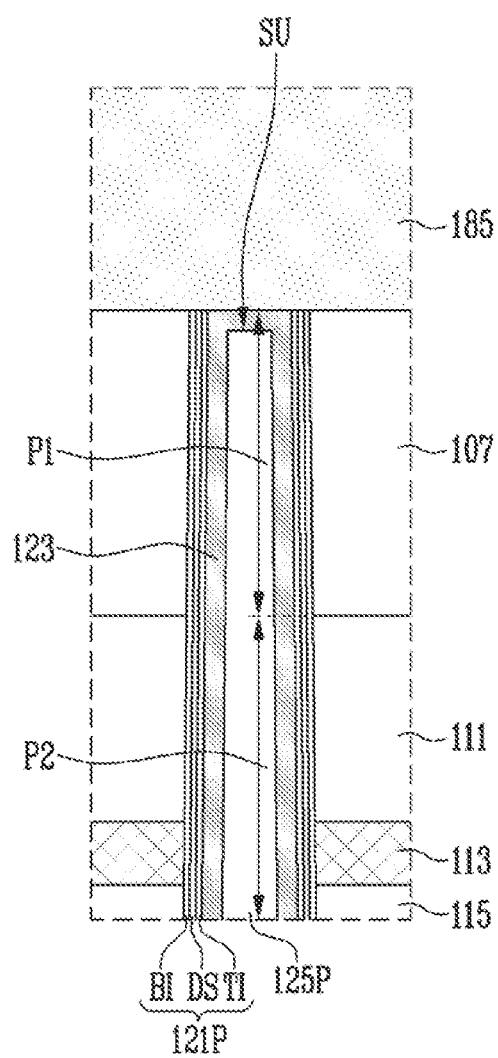

FIGS. 3A and 3B are sectional views illustrating an embodiment of the memory cell array MCA shown in FIG. 1. FIG. 3A is a sectional view of the memory cell array MCA taken along a direction intersecting the plurality of bit lines BL, and FIG. 3B is an enlarged sectional view of region A shown in FIG. 3A.

Referring to FIGS. 3A and 3B, the memory cell array MCA may include a bit line BL, a gate stack structure GST, a cell plug CPL, a filling insulating layer 107, a first etch stop pattern 103P, a second etch stop pattern 105P, and a common source pattern CSL.

The common source pattern CSL and the bit line BL are conductive patterns for transmitting a signal, and may include various conductive materials. The common source pattern CSL may be disposed over the bit line BL. The common source pattern CSL and the bit line BL may be spaced apart from each other in a Z-axis direction. The common source pattern CSL may include a doped semiconductor layer 185. The doped semiconductor layer 185 may include at least one of an n-type impurity and a p-type impurity. In an embodiment, the doped semiconductor layer 185 may include an n-type impurity.

The gate stack structure GST and the filling insulating layer 107 may be disposed between the bit line BL and the common source pattern CSL, and be sequentially disposed in the Z-axis direction. In other words, the filling insulating layer 107 may be disposed between the bit line BL and the common source pattern CSL, and the gate stack structure GST may be disposed between the bit line BL and the filling insulating layer 107.

The gate stack structure GST may include a first interlayer insulating layer 111, and a plurality of conductive patterns 113 and a plurality of second interlayer insulating layers 115 between the first interlayer insulating layer 111 and the bit line BL. The plurality of conductive patterns 113 and the plurality of second interlayer insulating layers 115 may be alternately disposed one by one in the Z-axis direction.

The first interlayer insulating layer 111 and each second interlayer insulating layer 115 may include the same insulating material. In an embodiment, the first interlayer insulating layer 111 and the second interlayer insulating layers 115 may include a silicon oxide, for example, silicon dioxide $SiO_2$.

The plurality of conductive patterns 113 may be insulated from each other by the plurality of second interlayer insulating layers 115. At least one conductive pattern adjacent to the common source pattern CSL among the plurality of conductive patterns 113 may be used as the source select line SSL described with reference to FIG. 2. At least one conductive pattern adjacent to the bit line BL among the plurality of conductive patterns 113 may be used as the drain select line DSL described with reference to FIG. 2. Conductive patterns between the source select line and the drain select line among the plurality of conductive patterns 113 may be used as the word lines described with reference to FIG. 2.

The first etch stop pattern 103P may be disposed on a sidewall SW1 of the filling insulating layer 107. The second etch stop pattern 105P may be disposed between the first etch stop pattern 103P and the filling insulating layer 107. The first etch stop pattern 103P and the second etch stop pattern 105P may be disposed at a level where the filling insulating layer 107 is disposed.

The memory cell array MCA may further include a semiconductor pattern 101P on a sidewall SW2 of the first etch stop pattern 103P. The semiconductor pattern 101P may be disposed at a level where the filling insulating layer 107 is disposed. The semiconductor pattern 101P may be configured as a semiconductor wafer.

In accordance with the above-described embodiment of the present disclosure, the semiconductor pattern 101P, which is relatively bulky compared to the filling insulating layer 107, and the filling insulating layer 107 made of a material different from the semiconductor pattern 101P may be spaced apart from each other by the first etch stop pattern 103P and the second etch stop pattern 105P, which are of a liner type. The first etch stop pattern 103P may form an interface with the semiconductor pattern 101P, and the second etch stop pattern 105P may form an interface with the filling insulating layer 107. In the embodiment of the present disclosure, the first etch stop pattern 103P and the second etch stop pattern 105P serve as a buffer, so that stress applied to the semiconductor pattern 101P and the filling insulating layer 107 may be reduced.

From the viewpoint of a plane intersecting the Z-axis direction, the gate stack structure GST and the common source pattern CSL may be formed wider than the filling insulating layer 107. For example, the gate stack structure GST and the common source pattern CSL may extend to overlap with the first etch stop pattern 103P, the second etch stop pattern 105P, and the semiconductor pattern 101P. The semiconductor pattern 101P may be insulated from the conductive pattern 113 by the first Interlayer Insulating layer 111.

The cell plug CPL may include a memory pattern 121P, a channel layer 123, a core insulating pattern 125P, and a capping pattern 127P.

The channel layer 123 may include a semiconductor layer such as silicon. The channel layer 123 may be in contact with the doped semiconductor layer 185 of the common source pattern CSL, and extend toward the bit line BL. The channel layer 123 may include a first part P1 surrounded by the filling insulating layer 107 and a second part P2 surrounded by the gate stack structure GST. Stress applied to the channel layer 123 may be reduced by the first etch stop pattern 103P and the second etch stop pattern 105P, which serve as the buffer as described above.

The memory pattern 121P may be disposed between the second part P2 of the channel layer 123 and the gate stack structure GST. The memory pattern 121P may extend between the first part P1 of the channel layer 123 and the filling insulating layer 107. The memory pattern 121P may include a blocking insulating layer BI, a data storage layer DS, and a tunnel insulating layer TI. The blocking insulating layer BI may include a metal oxide layer, a silicon oxide layer, etc. The data storage layer DS may be configured as a material layer capable of storing data changed using Fowler-Nordheim tunneling. The material layer may include a nitride layer in which charges may be trapped. However, the embodiment of the present disclosure is not limited thereto, and the data storage layer DS may include a nano dot, etc. The tunnel insulating layer TI may include an insulating material through which charges may tunnel. In an embodiment, the tunnel insulating layer TI may include a silicon oxide layer.

The core insulating pattern 125P and the capping pattern 127P may be disposed in a central region of the channel layer 123.

The core insulating pattern 125P may have a surface SU facing the doped semiconductor layer 185. The surface SU of the core insulating pattern 125P may be spaced apart from the doped semiconductor layer 185 by the first part P1 of the channel layer 123, which extends between the core insulating pattern 125P and the doped semiconductor layer 185. In other words, the doped semiconductor layer 185 may overlap with the core insulating pattern 125P with the channel layer 123 interposed therebetween.

The capping pattern 127P may be disposed between the core insulating pattern 125P and the bit line BL. The capping pattern 127P may include a doped semiconductor layer. In an embodiment, the capping pattern 127P may include a doped silicon layer including an n-type impurity.

Conductivity type impurities (e.g., an n-type impurity) of the capping pattern 127P and the doped semiconductor layer 185 may be diffused into the channel layer 123. Accordingly, both ends of the channel layer 123, which are adjacent to the capping pattern 127P and the doped semiconductor layer 185, may include a conductivity type impurity.

The first etch stop pattern 103P, the second etch stop pattern 105P, and the filling insulating layer 107 may be designed in consideration of etch selectivity so as to reduce damage to the channel layer 123 in a process of manufacturing the semiconductor memory device. The first etch stop pattern 103P may include an insulating material having an etch selectivity with respect to the semiconductor wafer constituting the semiconductor pattern 101R In an embodiment, the filling insulating layer 107 may include at least one of a nitride layer and an oxide layer, and the second etch stop pattern 105P may include a silicon layer. The second etch stop pattern 105P may be insulated from the conductive pattern 113 by the first interlayer insulating layer 111.

The channel layer 123 may include a third part P3 protruding farther toward the bit line BL than the gate stack structure GST from the second part P2. The memory pattern 121P and the capping pattern 127P may extend toward the bit line BL along the third part P3.

The memory cell array MCA may include at least one insulating layer disposed between the gate stack structure GST and the bit line BL. In an embodiment, the memory cell array MCA may include a first insulating layer 131 between the gate stack structure GST and the bit line BL, a second insulating layer 135 between the first insulating layer 131 and the bit line BL, and a third insulating layer 139 between the second insulating layer 135 and the bit line BL. The first insulating layer 131 may cover an end portion of the cell plug CPL, which faces the bit line BL.

The bit line BL may penetrate a fourth insulating layer 143 overlapping with the third insulating layer 139. The bit line BL may be connected to the capping pattern 127P of the cell plug CPL via a bit line-channel connection structure BCC. The bit line-channel connection structure BCC may include conductive patterns having various structures. In an embodiment, the bit line-channel connection structure BCC may include a first conductive plug 133 extending to penetrate the first insulating layer 131 from the capping pattern 127P, a conductive pad 137 extending to penetrate the second insulating layer 135 from the first conductive plug 133, and a second conductive plug 141 extending to penetrate the third insulating layer 139 from the conductive pad 137.

Figure 4A:
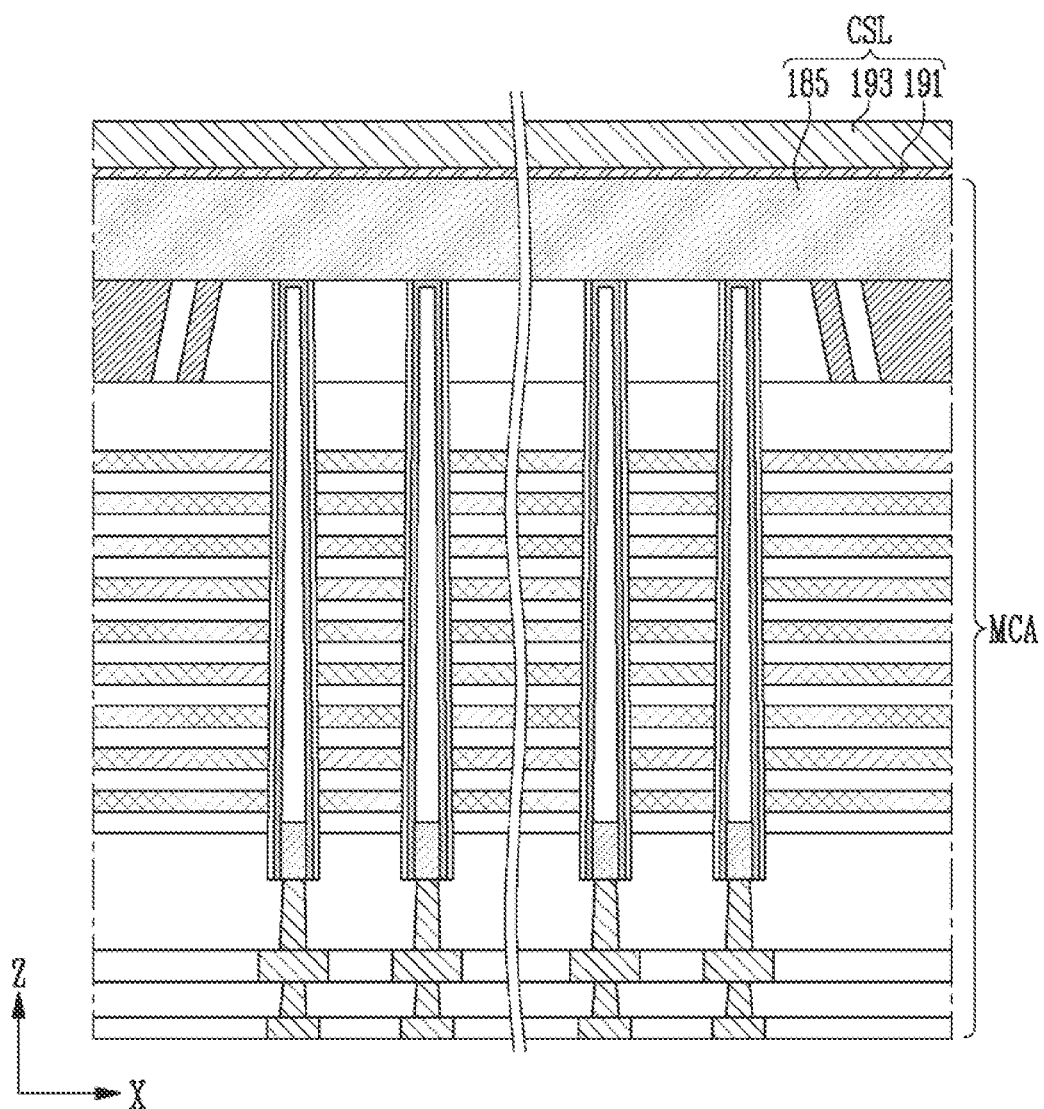
FIGS. 4A and 4B are sectional views illustrating a semiconductor memory device in accordance with an embodiment of the present disclosure.
Figure 4B:
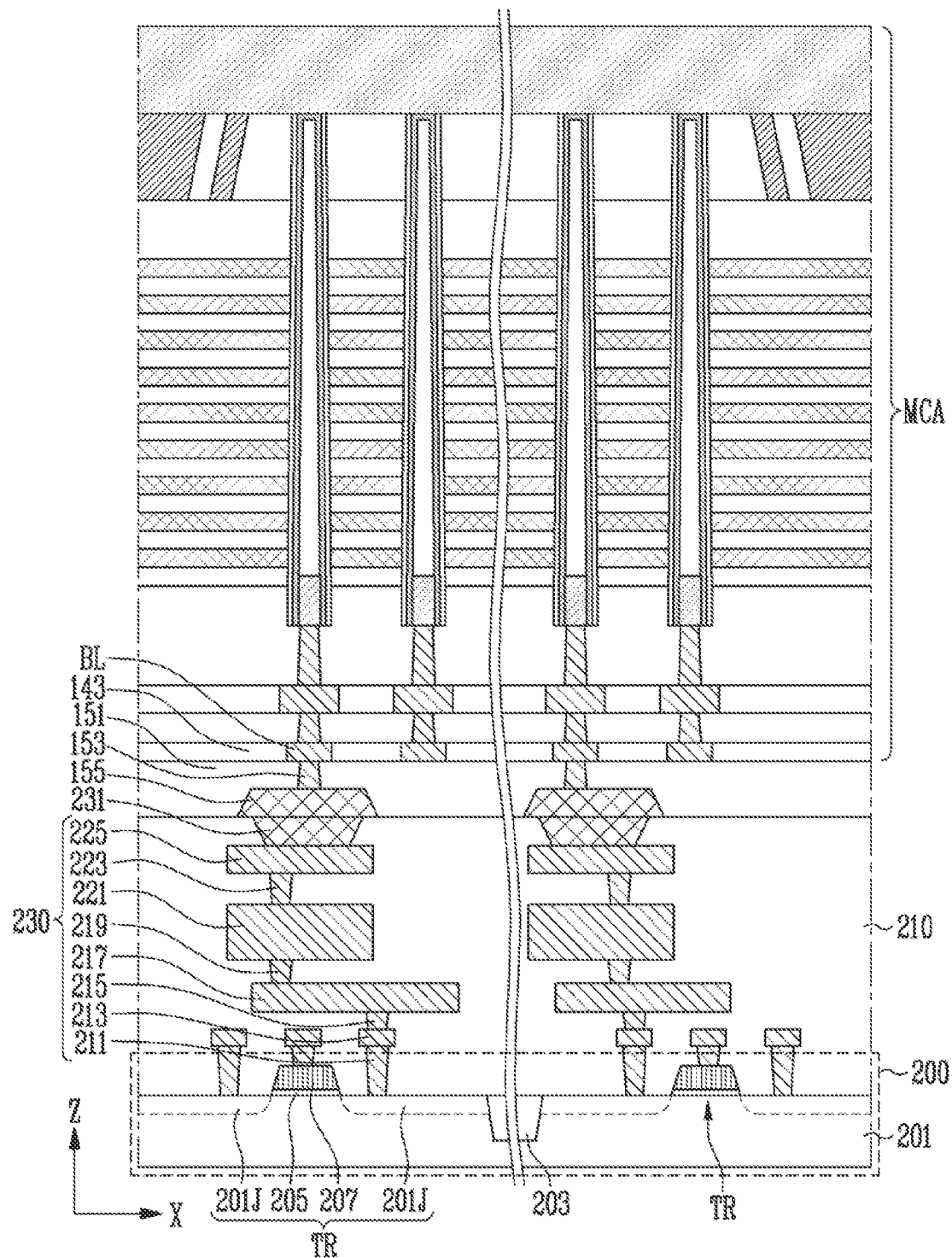

FIGS. 4A and 4B are sectional views illustrating a semiconductor memory device in accordance with an embodiment of the present disclosure. FIG. 4A is a sectional view illustrating an embodiment of a structure disposed on the memory cell array MCA shown in FIG. 3A, and FIG. 4B is a sectional view illustrating an embodiment of a structure disposed under the memory cell array MCA shown in FIG. 3A.

Referring to FIG. 4A, a common source pattern CSL of the semiconductor memory device may further include a metal barrier layer 191 and a metal layer 193, which are disposed on the doped semiconductor layer 185 of the memory cell array MCA described with reference to FIGS. 3A and 3B, in addition to the doped semiconductor layer 185. The resistance of the common source pattern CSL may be decreased by the metal layer 193.

Referring to FIG. 4B, the semiconductor memory device may include a peripheral circuit structure 200, a first interconnection 153, a second interconnection 230, a first conductive bonding pad 155, and a second conductive bonding pad 231. The peripheral circuit structure 200, the first interconnection 153, the second interconnection 230, the first conductive bonding pad 155, and the second conductive bonding pad 231 may be disposed under the memory cell array MCA described with reference to FIGS. 3A and 3B.

The peripheral circuit structure 200 may include a semiconductor substrate 201 and a plurality of transistors TR. The semiconductor substrate 201 may include silicon, germanium, etc. The semiconductor substrate 201 may include active regions divided by isolation layers 203.

The plurality of transistors TR may constitute a peripheral circuit for controlling an operation of the memory cell array MCA. In an embodiment, the plurality of transistors TR may include a transistor of a page buffer circuit for controlling a bit line BL. Each transistor TR may include a gate insulating layer 205, a gate electrode 207, and junctions 201J. The gate insulating layer 205 and the gate electrode 207 may be stacked on the active region of the semiconductor substrate 201. The junctions 201J may be provided as a source region and a drain region. The junctions 201J may be provided by doping at least one of an n-type impurity and a p-type impurity into the active regions exposed at both sides of the gate electrode 207.

The semiconductor substrate 201 and the plurality of transistors TR may be covered by a peripheral circuit-side insulating structure 210.

The first interconnection 153 and the first conductive bonding pad 155 may be formed in a cell array-side insulating structure 151 disposed between the peripheral circuit-side insulating structure 210 and the memory cell array MCA described with reference to FIGS. 3A and 3B. The cell array-side insulating structure 151 may include a single insulating layer or two or more insulating layers. The first interconnection 153 may include a conductive pattern having various structures. The first conductive bonding pad 155 may be connected to the bit line BL via the first interconnection 153.

The second interconnection 230 and the second conductive bonding pad 231 may be formed in the peripheral circuit-side insulating structure 210. The peripheral circuit-side insulating structure 210 may include two or more insulating layers. The second interconnection 230 may include a plurality of conductive patterns 211, 213, 215, 217, 219, 221, 223, and 225 connected to the transistor TR. The plurality of conductive patterns 211, 213, 215, 217, 219, 221, 223, and 225 may be formed in various structures. The second conductive bonding pad 231 may be connected to the transistor TR via the second interconnection 230.

The first interconnection 153 and the second interconnection 230 may be connected to each other by a mutual connection structure of the first conductive bonding pad 155 and the second conductive bonding pad 231. In an embodiment, the first conductive bonding pad 155 and the second conductive bonding pad 231 may be coupled to each other through a bonding process.

According to the above-described structure, the bit line BL may be connected to the transistor TR via the first interconnection 153, the first conductive bonding pad 155, the second conductive bonding pad 231, and the second interconnection 230.

Hereinafter, a manufacturing method of a semiconductor memory device in accordance with an embodiment of the present disclosure will be described.

Figure 5A:
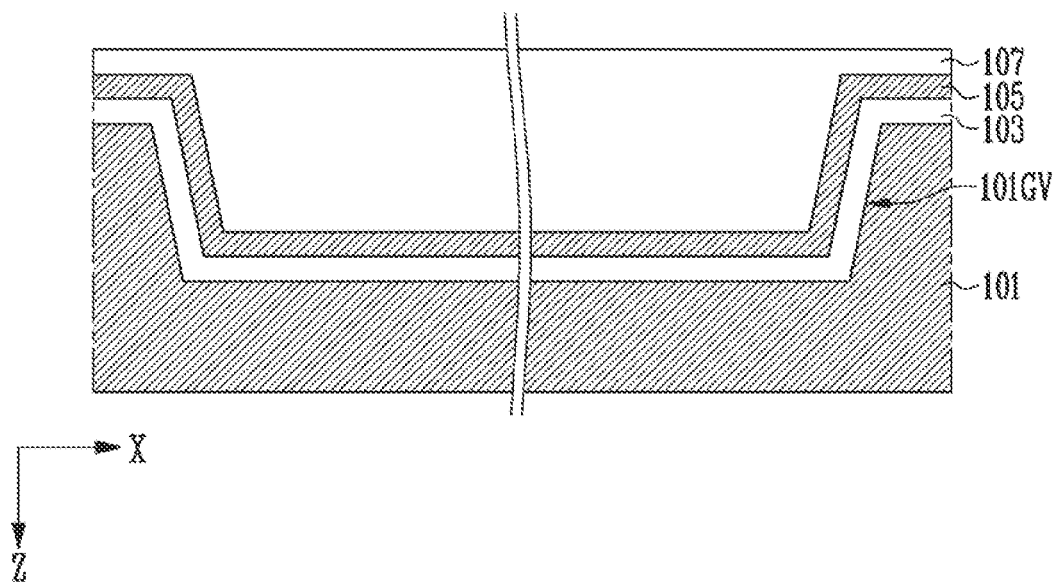
FIGS. 5A to 5C are sectional views illustrating a process of forming a protection pattern and a process of forming a preliminary memory cell array.
Figure 5B:
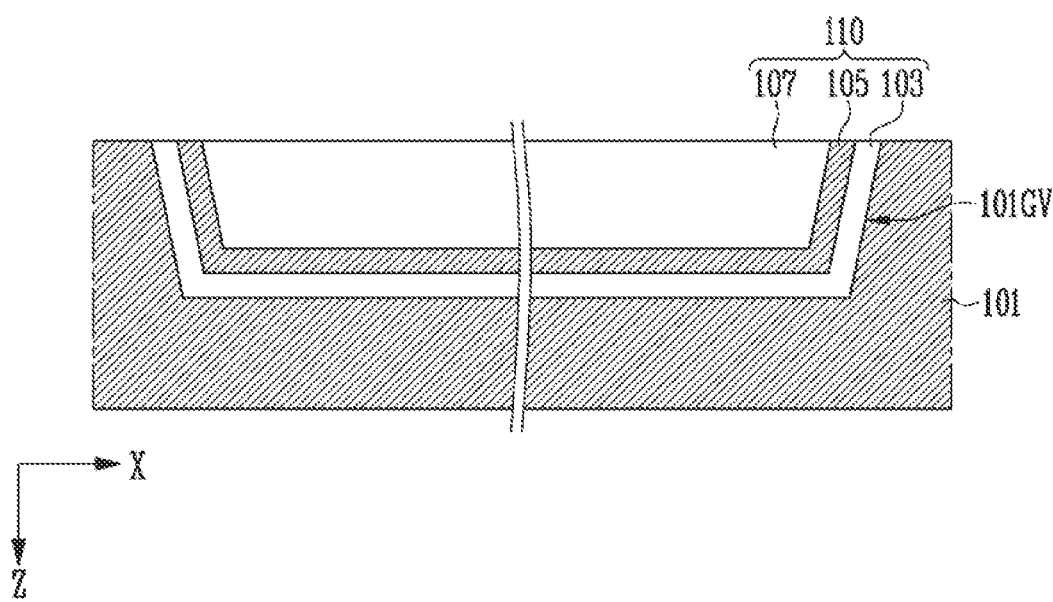
Figure 5C:
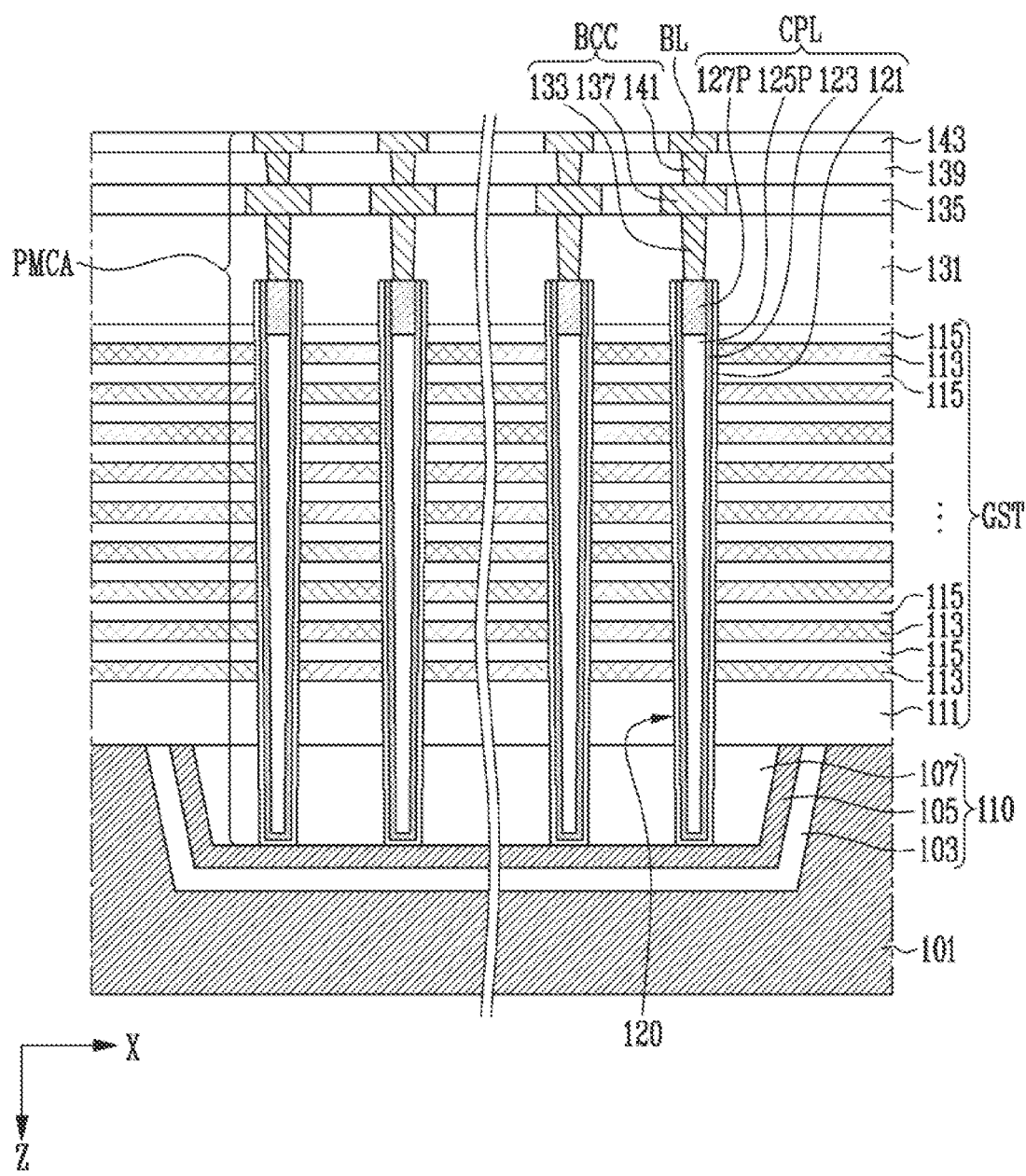

FIGS. 5A to 5C are sectional views illustrating a process of forming a protection pattern and a process of forming a preliminary memory cell array.

Referring to FIG. 5A, the process of forming the protection pattern may include a process of forming a groove 101GV by etching a substrate 101 and a process of sequentially forming a first etch stop layer 103, a second etch stop layer 105, and a filling insulating layer 107 in the groove 101GV.

The substrate 101 may be a semiconductor wafer. In an embodiment, the substrate 101 may include a silicon layer.

The first etch stop layer 103 and the second etch stop layer 105 may be sequentially stacked along a surface of the groove 101GV. The first etch stop layer 103 and the second etch stop layer 105 may be conformally formed along a surface of the substrate 101 including the groove 101GV. The first etch stop layer 103 may include an insulating material having an etch selectivity with respect to the substrate 101.

The filling insulating layer 107 may be formed on the second etch stop layer 105 to fill a central region of the groove 101GV. The filling insulating layer 107 may include a material having an etch selectivity with respect to the second etch stop layer 105. In an embodiment, the second etch stop layer 105 may include a silicon layer, and the filling insulating layer 107 may include at least one of a nitride layer and an oxide layer.

Referring to FIG. 5B, planarization may be carried out on the filling insulating layer 107, the second etch stop layer 105, and the first etch stop layer 103, such that the substrate 101 is exposed. Accordingly, a protection pattern 110 filling the groove 101GV of the substrate 101 may be defined. The protection pattern 110 may include the filling insulating layer 107, the second etch stop layer 105, and the first etch stop layer 103, which remain in the groove 101GV.

Referring to FIG. 5C, after the protection pattern 110 is formed, a preliminary memory cell array PMCA may be formed on the substrate 101. The preliminary memory cell array PMCA may include a gate stack structure GST on the filling insulating layer 107, a hole 120 penetrating the gate stack structure GST and the filling insulating layer 107, and a cell plug CPL filling the hole 120. The cell plug CPL may include a memory layer 121 extending along a surface of the hole 120, a channel layer 123 on the memory layer 121, a core insulating pattern 125P and a capping pattern 127P, which fill a central region of the hole 120, and a bit line BL is connected to the capping pattern 127P.

The gate stack structure GST may include a first interlayer insulating layer 111 on the filling insulating layer 107, and a plurality of conductive patterns 113 and a plurality of second interlayer insulating layers 115, which are alternately stacked on the first interlayer insulating layer 111.

In an embodiment, the process of forming the gate stack structure GST may include a process of forming the first interlayer insulating layer 111, a process of sequentially stacking a plurality of sacrificial layers (not shown) and the plurality of second interlayer insulating layers 115 on the first interlayer insulating layer 111, a process of forming the hole 120 penetrating the plurality of sacrificial layers (not shown), the plurality of second interlayer insulating layers 115, the first interlayer insulating layer 111, and the filling insulating layer 107 through an etching process using a mask pattern (not shown) as an etch barrier, a process of forming the cell plug CPL in the hole 120, and a process of replacing the plurality of sacrificial layers with the plurality of conductive patterns 113. The mask pattern may be removed after the cell plug CPL is formed.

The first interlayer insulating layer 111 and the second interlayer insulating layer 115 may include an oxide layer, and the sacrificial layer may include a nitride layer having an etch selectivity with respect to the oxide layer. Because the filling insulating layer 107 includes at least one of an oxide layer and a nitride layer like the sacrificial layer, the first interlayer insulating layer 111, and the second interlayer insulating layer 115, the filling insulating layer 107 may be removed through the etching process for forming the hole 120. Because the second etch stop layer 105 includes a material having an etch selectivity with respect to the oxide layer, the nitride layer, and the filling insulating layer 107, the second etch stop layer 105 may have etch resistance with respect to the etching process for forming the hole 120. Accordingly, the second etch stop layer 105 may be used as an etch stop layer during the etching process for forming the hole 120.

The memory layer 121 of the cell plug CPL may include a blocking insulating layer BI, a data storage layer DS, and a tunnel insulating layer TI as shown in FIG. 3B. The channel layer 123 may include a semiconductor layer. The core insulating pattern 125P may be formed to have a height lower than that of the channel layer 123. The capping pattern 127P may include a doped semiconductor layer as described with reference to FIGS. 3A and 3B, and overlap with the core insulating pattern 125P. A conductivity type impurity in the capping pattern 127P may be diffused into the channel layer 123 from a sidewall of the channel layer 123, which is in contact with the capping pattern 127P.

Subsequently, a region in which the mask pattern is removed may be filled with a first insulating layer 131. The cell plug CPL may be covered by the first insulating layer 131.

The process of forming the bit line BL connected to the cell plug CPL may include a process of forming a bit line-channel connection structure BCC connected to the capping pattern 127P of the cell plug CPL and a process of forming the bit line BL connected to the bit line-channel connection structure BCC. In an embodiment, the process of forming the bit line-channel connection structure BCC may include a process of forming a first conductive plug 133 penetrating the first insulating layer 131, a process of forming a second insulating layer 135 covering the first conductive plug 133 and the first insulating layer 131, a process of forming a conductive pad 137 penetrating the second insulating layer 135, a process of forming a third insulating layer 139 covering the conductive pad 137 and the second insulating layer 135, and a process of forming a second conductive plug 141 penetrating the third insulating layer 139.

The process of forming the bit line BL may include a process of forming a fourth insulating layer 143 covering the second conductive plug 141 and the third insulating layer 139, a process of forming a trench which penetrates the fourth insulating layer 143 and exposes the bit line-channel connection structure BCC, and a process of filling the trench with a conductive material.

Figure 6:
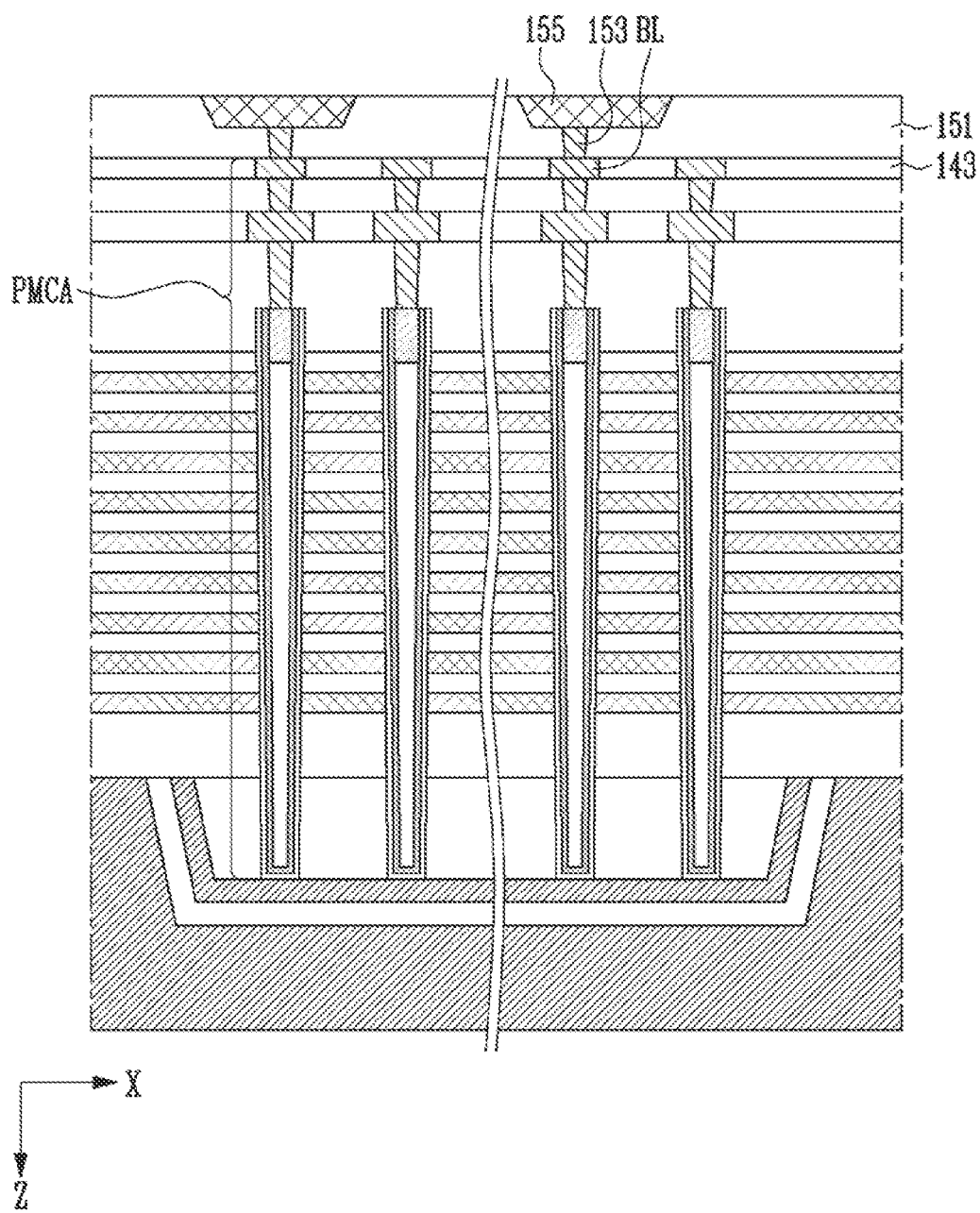
FIG. 6 is a sectional view illustrating a process of forming a first interconnection and a first conductive bonding pattern.

FIG. 6 is a sectional view illustrating a process of forming a first interconnection and a first conductive bonding pattern.

Referring to FIG. 6, a cell array-side insulating structure 151, and a first interconnection 153 and a first conductive bonding pad 155, which are buried in the cell array-side insulating structure 151, may be formed on the preliminary memory cell array structure PMCA.

The cell array-side insulating structure 151 may include a single insulating layer or two or more insulating layers. The first interconnection 153 may be connected to the bit line BL. The structure of the first interconnection 153 is not limited to that shown in the drawing, and the first interconnection 153 may include a conductive pattern having various structures. The first conductive bonding pad 155 may be connected to the first interconnection 153, and include a bonding surface which is not covered by the cell array-side insulating structure 151.

Figure 7:
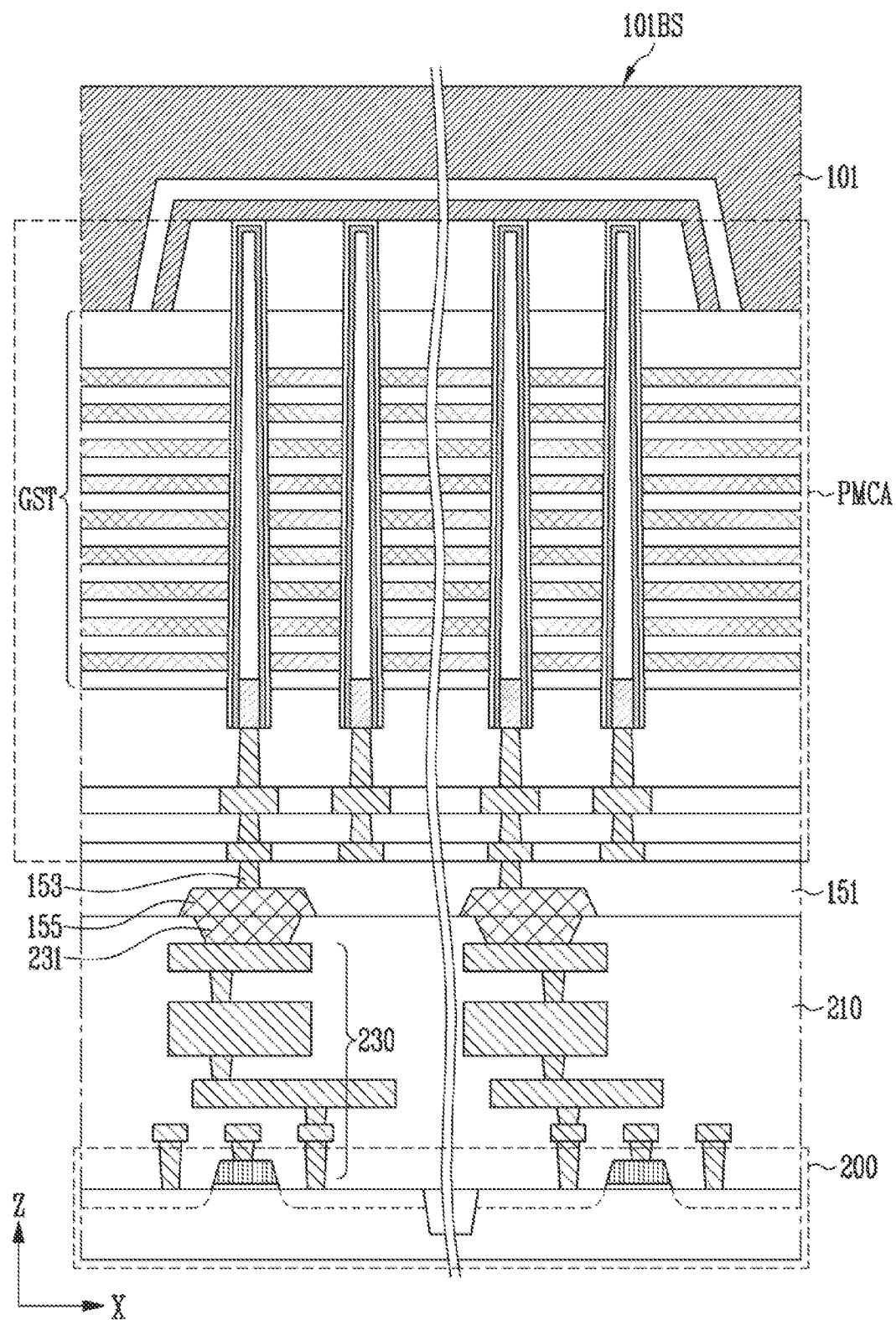
FIG. 7 is a sectional view illustrating a process of bonding the first conductive bonding pad to a structure including a peripheral circuit structure, a second interconnection, and a second conductive bonding pad.

FIG. 7 is a sectional view illustrating a process of bonding the first conductive bonding pad to a structure including a peripheral circuit structure, a second interconnection, and a second conductive bonding pad.

Referring to FIG. 7, a structure including the peripheral circuit structure 200, the second interconnection 230, and the second conductive bonding pad 231, which are described above with reference to FIG. 4B, may be provided through an individual manufacturing process distinguished from that of the preliminary memory cell array PMCA. Accordingly, a phenomenon by which the peripheral circuit structure 200 is degraded by heat generated in the process of forming the preliminary memory cell array PMCA may be avoided in advance.

The second interconnection 230 and the second conductive bonding pad 231 may be buried in a peripheral circuit-side insulating structure 210 covering the peripheral circuit structure 200. The second conductive bonding pad 231 may be connected to the peripheral circuit structure 200 via the second interconnection 230, and include a bonding surface which is not covered by the peripheral circuit-side insulating structure 210.

The first conductive bonding pad 155 may be bonded to the second conductive bonding pad 231. In addition, the peripheral circuit-side insulating structure 210 may be bonded to the cell array-side insulating structure 151.

FIGS. 8A to 8D are sectional views illustrating a process of exposing the channel layer.

Figure 8A:
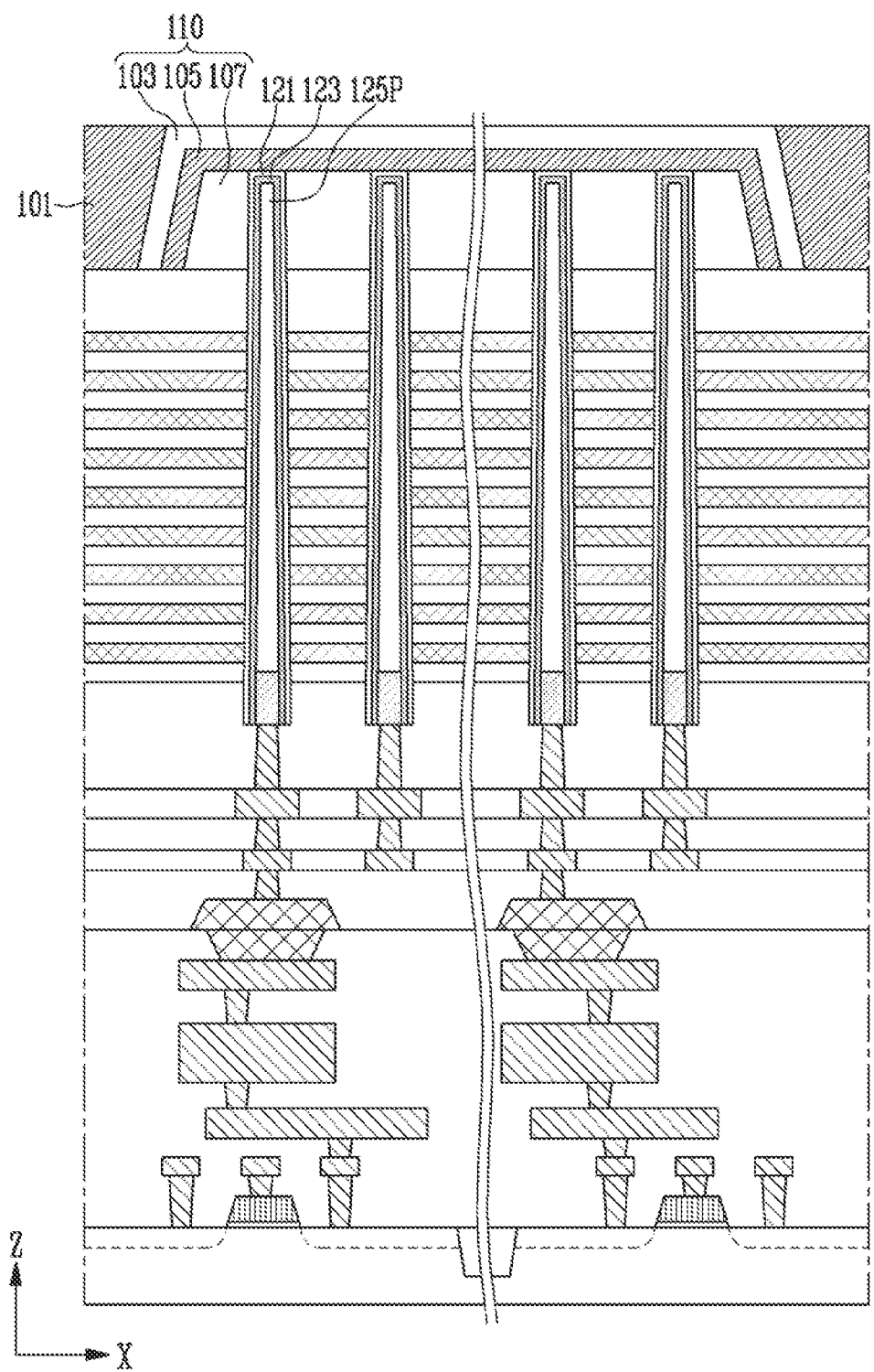
FIGS. 8A to 8D are sectional views illustrating a process of exposing a channel layer.

Referring to FIG. 8A, the first etch stop layer 103 may be exposed by removing a portion of the substrate 101 from a back surface 101BS of the substrate 101 shown in FIG. 7. The back surface 101BS of the substrate 101 shown in FIG. 7 may be defined as the surface of the substrate 101 that faces in an opposite direction to the surface facing the gate stack structure GST.

The process of removing the portion of the substrate 101 may include a planarization process such as chemical mechanical polishing (CMP). The first etch stop layer 103 having an etch selectivity with respect to substrate 101 may be used to detect a planarization end point, and the planarization process may be stopped when the first etch stop layer 103 is exposed. Accordingly, the channel layer 123 is not exposed while the portion of the substrate 101 is removed. The channel layer 123 may be protected by the protection pattern 110 including the first etch stop layer 103.

Figure 8B:
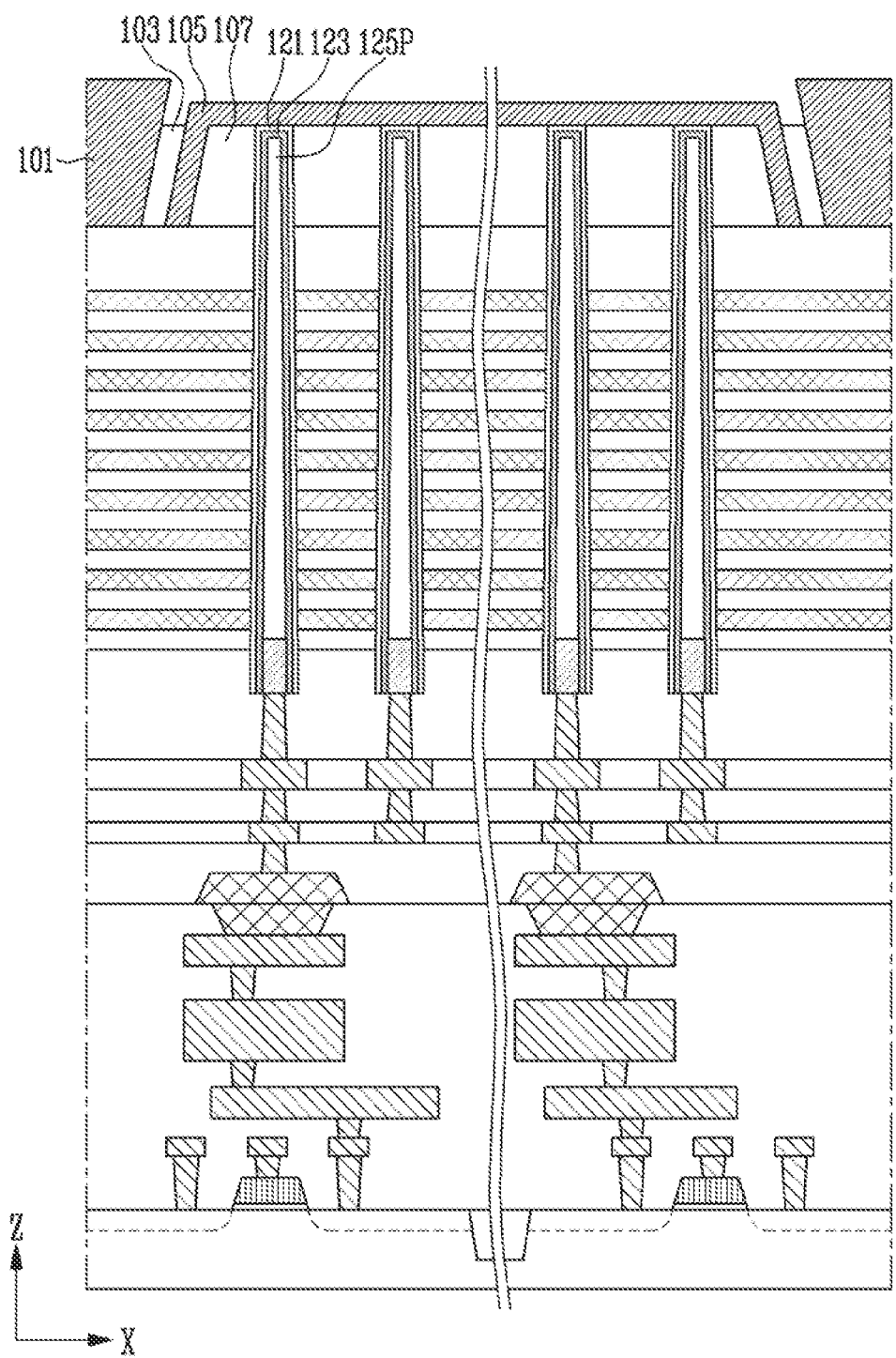

Referring to FIG. 8B, a portion of the first etch stop layer 103 may be selectively removed such that the second etch stop layer 105 is exposed. Accordingly, the channel layer 123 may be protected by the second etch stop layer 105 while the portion of the first etch stop layer 103 is selectively removed.

Figure 8C:
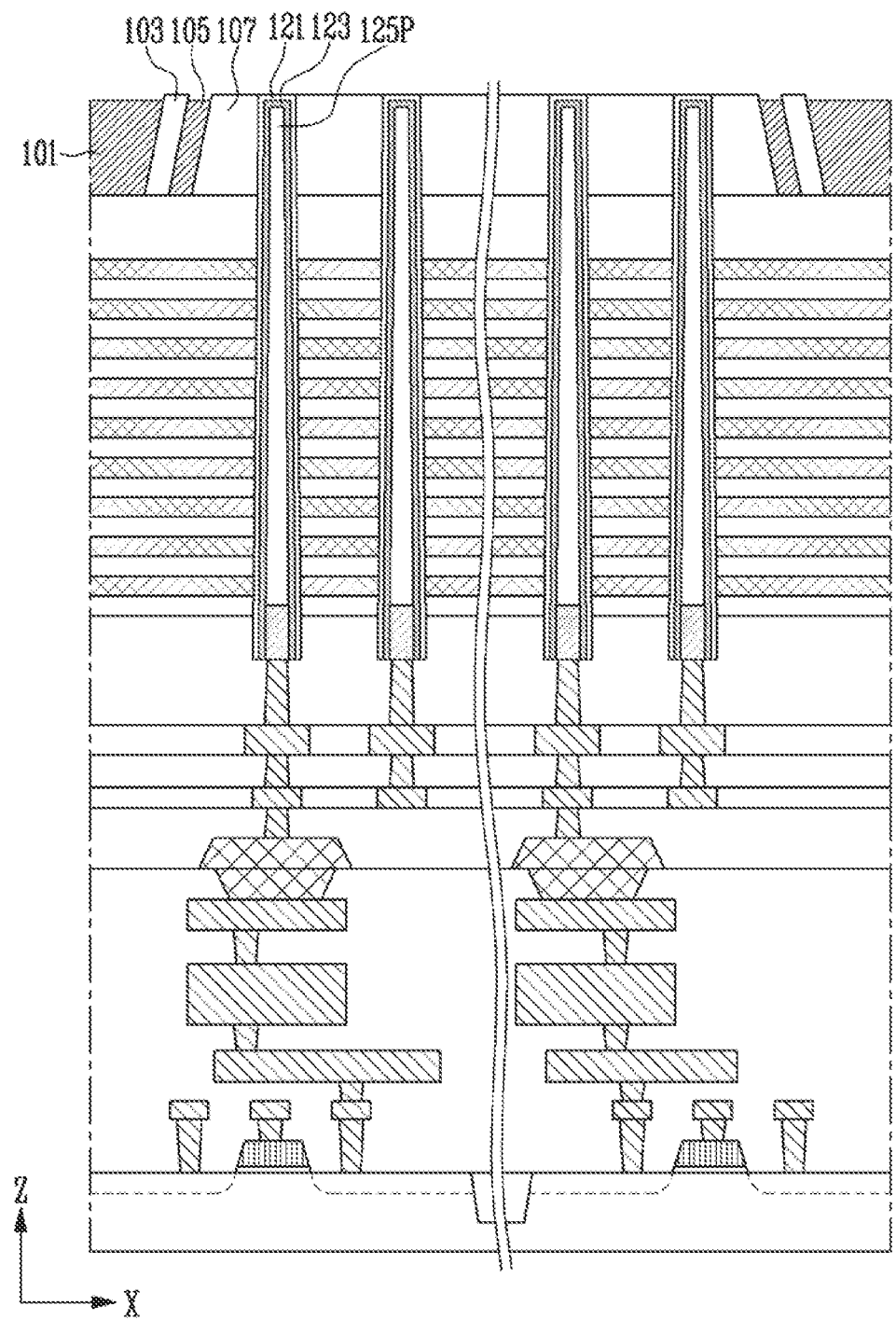

Referring to FIG. 8C, a portion of the second etch stop layer 105 may be selectively removed such that the memory layer 121 is exposed. Accordingly, the channel layer 123 may be protected by the memory layer 121 while the portion of the second etch stop layer 105 is selectively removed.

Figure 8D:
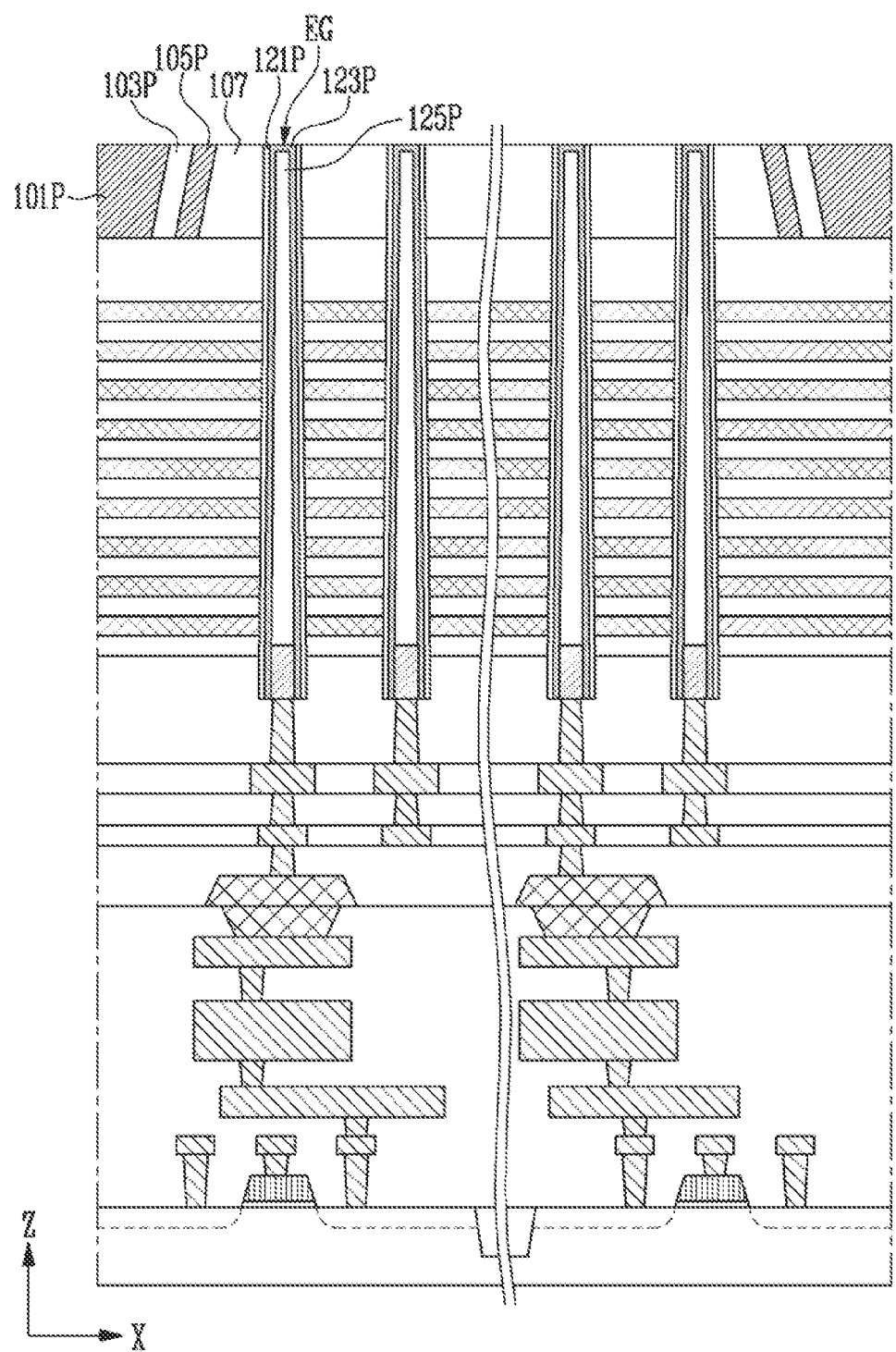

Referring to FIG. 8D, a portion of the memory layer 121 shown in FIG. 8C may be selectively removed such that the channel layer 123 is exposed. Accordingly, a memory pattern 121P may be defined. A remaining portion of the substrate may be defined as a semiconductor pattern 101P, a remaining portion of the first etch stop layer may be defined as a first etch stop pattern 103P, and a remaining portion of the second etch stop layer may be defined as a second etch stop pattern 105P.

As described above, the channel layer 123 may be exposed through a plurality of selective etching processes including a process of removing a portion of the substrate, a process of removing a portion of the first etch stop layer, a process of removing a portion of the second etch stop layer, and a process of removing a portion of the memory layer. According to this method, damage of the channel layer 123 may be reduced as compared with when the channel layer 123 is exposed through a one-time etching process, and a state in which the core insulating pattern 125P is sealed by an end portion EG of the channel layer 123 may be stably maintained. Because the channel layer 123 is supported by the filling insulating layer 107, damage such as the occurrence of cracks in the channel layer 123 due to an external force may be reduced.

Figure 9:
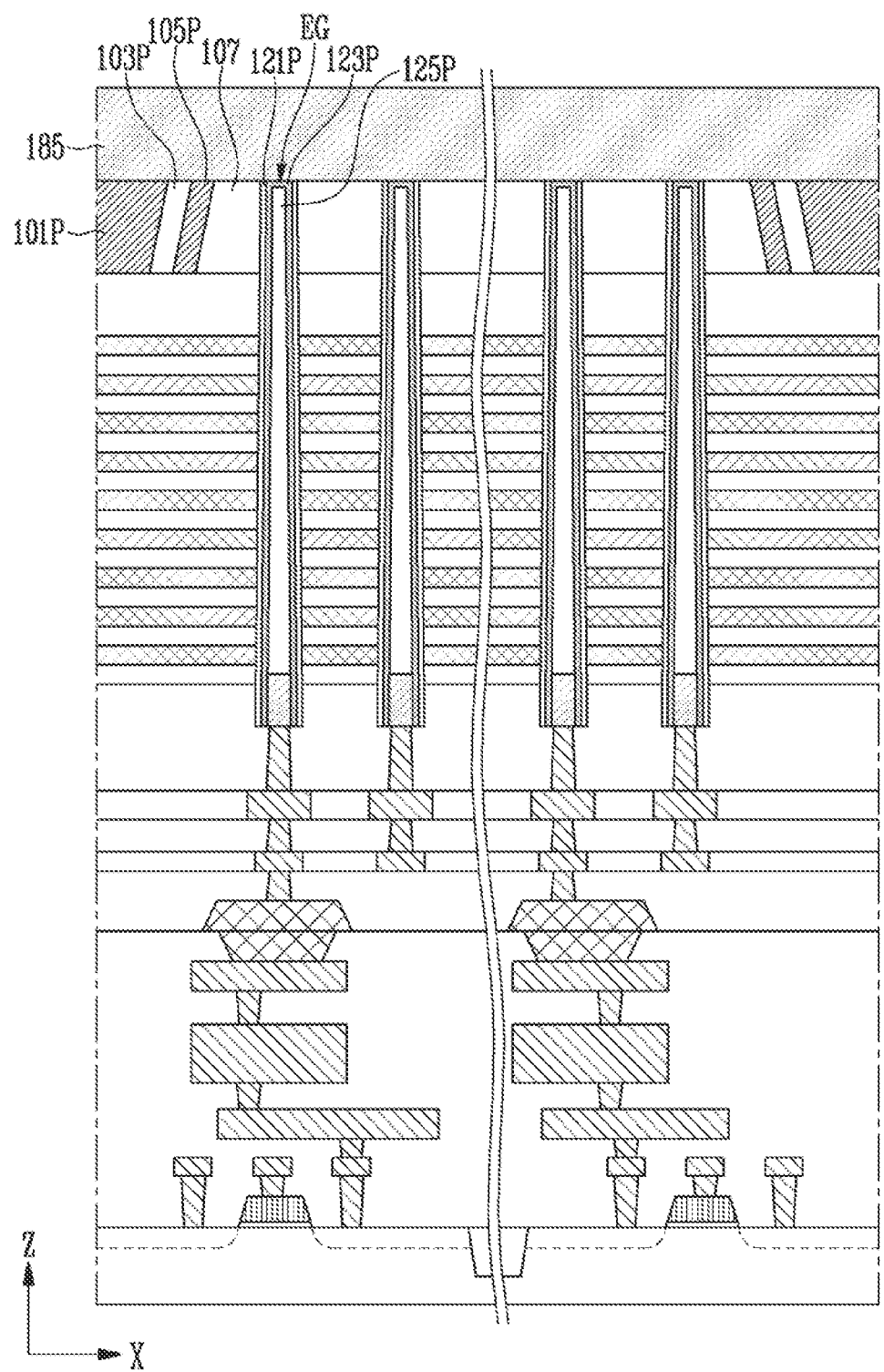
FIG. 9 is a sectional view illustrating a process of forming a doped semiconductor layer.

FIG. 9 is a sectional view illustrating a process of forming a doped semiconductor layer.

Referring to FIG. 9, a doped semiconductor layer 185 may be formed, which is in contact with the exposed end portion EG of the channel layer 123. The doped semiconductor layer 185 is a common source pattern as described with reference to FIGS. 3A and 3B, and may include a conductivity type impurity.

The doped semiconductor layer 185 may extend to overlap with the filling insulating layer 107, the second etch stop pattern 105P, the first etch stop pattern 103R and the semiconductor pattern 101R The conductivity type impurity of the doped semiconductor layer 185 may be diffused into the channel layer 123.

Although not shown in the drawing, before the doped semiconductor layer 185 is formed, a process of injecting a conductivity type impurity into the channel layer 123 may be performed. The second etch stop pattern 105P and the semiconductor pattern 101P, which include silicon, may be electrically connected to each other by the doped semiconductor layer 185.

In accordance with the embodiment of the present disclosure, contact between the core insulating pattern 125P and the doped semiconductor layer 185 may be blocked by the end portion EG of the channel layer 123. Accordingly, although a void or seam remains at the inside of a portion of the core insulating pattern 125P adjacent to the end portion EG of the channel layer 123, a failure in which the doped semiconductor layer 185 infiltrates into the void or seam may be postponed or avoided by the end portion EG of the channel layer 123. As a result, a leakage current caused by the doped semiconductor layer infiltrating into the void or seam may be reduced, and thus the operational reliability of the semiconductor memory device may be improved.

After the doped semiconductor layer 185 is formed, a subsequent process for the metal barrier layer 191 and the metal layer 193, which are shown in FIG. 4A, may be performed.

Figure 10:
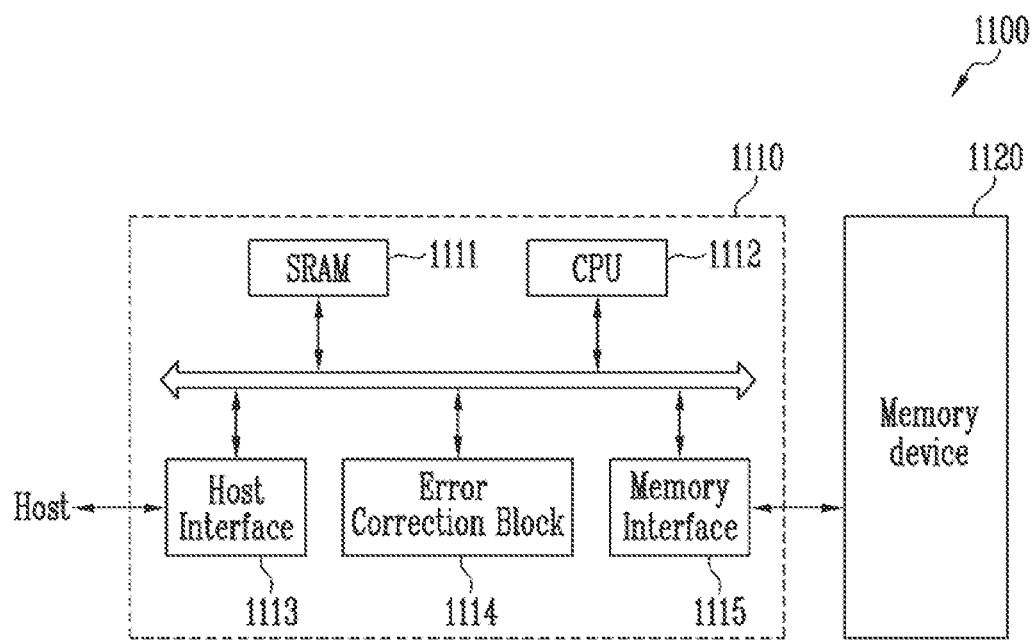
FIG. 10 is a block diagram illustrating a configuration of a memory system in accordance with an embodiment of the present disclosure.

FIG. 10 is a block diagram illustrating a configuration of a memory system in accordance with an embodiment of the present disclosure.

Referring to FIG. 10, a memory system 1100 includes a memory device 1120 and a memory controller 1110.

The memory device 1120 may be a multi-chip package configured with a plurality of flash memory chips. The memory device 1120 may include a channel layer connected between a bit line and a common source pattern, a filling insulating layer surrounding a first part of the channel layer, a gate stack structure surrounding a second part of the channel layer between the bit line and the filling insulating layer, a first etch stop pattern on a sidewall of the filling insulating layer, a second etch stop pattern between the first etch stop pattern and the filling insulating layer, and a memory pattern between the gate stack structure and the channel layer.

The memory controller 1110 controls the memory device 1120, and relay include Static Random Access Memory (SRAM) 1111, a Central Processing Unit (CPU) 1112, a host interface 1113, an error correction block 1114, and a memory interface 1115. The SRAM 1111 is used as operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in data read from the memory device 1120, and corrects the detected error. The memory interface 1115 interfaces with the memory device 1120. The memory controller 1110 may further include Read Only Memory (ROM) for storing code data for interfacing with the host, and the like.

The memory system 1100 configured as described above may be a memory card or a Solid State Disk (SSD), in which the memory device 1120 is combined with the memory controller 1110. For example, when the memory system 1100 is an SSD, the memory controller 1110 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 11:
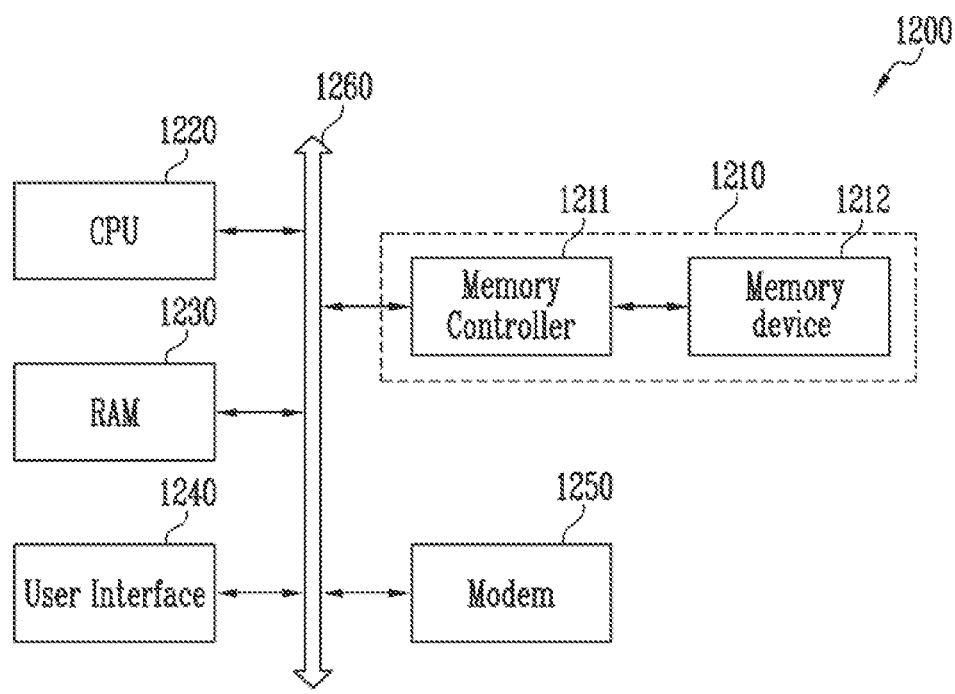
FIG. 11 is a block diagram illustrating a configuration of a computing system in accordance with an embodiment of the present disclosure.

FIG. 11 is a block diagram illustrating a configuration of a computing system in accordance with an embodiment of the present disclosure.

Referring to FIG. 11, a computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, mobile DRAM, and the like may be further included.

The memory system 1210 may be configured with a memory device 1212 and a memory controller 1211.

The memory device 1212 may include a channel layer connected between a bit line and a common source pattern, a filling insulating layer surrounding a first part of the channel layer, a gate stack structure surrounding a second part of the channel layer between the bit line and the filling insulating layer, a first etch stop pattern on a sidewall of the filling insulating layer, a second etch stop pattern between the first etch stop pattern and the filling insulating layer; and a memory pattern between the gate stack structure and the channel layer.

The memory controller 1211 may have the same configuration as the memory controller 1110 described above with reference to FIG. 10.

In accordance with some embodiments of the present disclosure, etch selectivities between a first etch stop layer, a second etch stop layer, and a filling insulating layer, which are disposed in a groove of a substrate, are used, so that a phenomenon by which a channel layer is damaged in a process of exposing the channel layer may be reduced. Accordingly, a leakage current caused by the damage of the channel layer may be reduced, and thus operational reliability of the semiconductor memory device may be improved.

What is claimed is:

1. A semiconductor memory device comprising:
a bit line;
a common source pattern above the bit line;
a channel layer in contact with the common source pattern, the channel layer extending toward the bit line;
a filling insulating layer disposed between the bit line and the common source pattern, the filling insulating layer surrounding a first part of the channel layer;
a gate stack structure disposed between the bit line and the filling insulating layer, the gate stack structure surrounding a second part of the channel layer;
a first etch stop pattern on a sidewall of the filling insulating layer;
a second etch stop pattern between the first etch stop pattern and the filling insulating layer; and
a memory pattern between the gate stack structure and the channel layer,
wherein a first sidewall of the second etch stop pattern which is in contact with the filling insulating layer and a second sidewall of the second etch stop pattern which is in contact with the first etch stop pattern are inclined in the same direction.

2. The semiconductor memory device of claim 1, wherein the filling insulating layer includes a material having an etch selectivity with respect to the second etch stop pattern.

3. The semiconductor memory device of claim 2, wherein the filling insulating layer includes at least one of a nitride layer and an oxide layer.

4. The semiconductor memory device of claim 2, wherein the second etch stop pattern includes a silicon layer.

5. The semiconductor memory device of claim 1, wherein the first etch stop pattern includes an insulating material having an etch selectivity with respect to a semiconductor wafer.

6. The semiconductor memory device of claim 5, wherein the first etch stop pattern includes an oxide layer.

7. The semiconductor memory device of claim 1, wherein the first etch stop pattern and the second etch stop pattern are disposed at a level where the filling insulating layer is disposed.

8. The semiconductor memory device of claim 1, wherein the gate stack structure extends to overlap with the first etch stop pattern and the second etch stop pattern.

9. The semiconductor memory device of claim 1, further comprising a semiconductor pattern on a sidewall of the first etch stop pattern.

10. The semiconductor memory device of claim 9, wherein the gate stack structure extends to be overlapped by the semiconductor pattern.

11. The semiconductor memory device of claim 1, further comprising a core insulating pattern disposed in a central region of the channel layer,
wherein the channel layer extends between the core insulating pattern and the common source pattern.

12. The semiconductor memory device of claim 11, wherein:
the common source pattern includes a doped semiconductor layer in contact with the channel layer; and
the doped semiconductor layer overlaps the core insulating pattern with the channel layer interposed between the doped semiconductor layer and the core insulating pattern.

13. The semiconductor memory device of claim 1, wherein the first etch stop pattern and the second etch stop pattern are disposed at the same level.

14. The semiconductor memory device of claim 1, wherein the first sidewall and the second sidewall are disposed at the same level.

15. The semiconductor memory device of claim 1, wherein the first sidewall and the second sidewall face opposite directions.

* * * * *